(12) United States Patent
Lin et al.

(10) Patent No.: US 8,822,284 B2
(45) Date of Patent: Sep. 2, 2014

(54) METHOD FOR FABRICATING FINFETS AND SEMICONDUCTOR STRUCTURE FABRICATED USING THE METHOD

(75) Inventors: Chin-Fu Lin, Tainan (TW); Chin-Cheng Chien, Tainan (TW); Chun-Yuan Wu, Yunlin County (TW); Teng-Chun Tsai, Tainan (TW); Chih-Chien Liu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/370,231

(22) Filed: Feb. 9, 2012

(65) Prior Publication Data

US 2013/0207122 A1 Aug. 15, 2013

(51) Int. Cl.
| | |
|---|---|
| *H01L 29/06* | (2006.01) |
| *H01L 29/78* | (2006.01) |
| *H01L 21/8234* | (2006.01) |
| *H01L 27/088* | (2006.01) |
| *H01L 21/02* | (2006.01) |
| *H01L 21/3115* | (2006.01) |
| *H01L 21/311* | (2006.01) |
| *H01L 21/318* | (2006.01) |
| *H01L 21/314* | (2006.01) |

(52) U.S. Cl.
CPC ..... *H01L 21/823431* (2013.01); *H01L 27/0886* (2013.01); *H01L 21/02381* (2013.01); *H01L 21/02532* (2013.01); *H01L 21/02636* (2013.01); *H01L 21/3115* (2013.01); *H01L 21/31111* (2013.01); *H01L 21/31116* (2013.01); *H01L 21/3185* (2013.01); *H01L 21/3141* (2013.01)
USPC ........... 438/197; 438/275; 257/288; 257/401; 257/618; 257/623; 257/E21.618; 257/E21.619

(58) Field of Classification Search
None
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo et al. | |
| 6,500,725 B1 * | 12/2002 | Chen et al. | 438/401 |
| 6,921,963 B2 | 7/2005 | Krivokapic et al. | |
| 7,087,477 B2 | 8/2006 | Fried et al. | |
| 7,091,551 B1 | 8/2006 | Anderson et al. | |
| 7,247,887 B2 | 7/2007 | King et al. | |
| 7,250,658 B2 | 7/2007 | Doris et al. | |
| 7,309,626 B2 | 12/2007 | Ieong et al. | |
| 7,352,034 B2 | 4/2008 | Booth, Jr. et al. | |
| 7,470,570 B2 | 12/2008 | Beintner et al. | |
| 7,531,437 B2 | 5/2009 | Brask et al. | |
| 7,569,857 B2 | 8/2009 | Simon et al. | |

(Continued)

OTHER PUBLICATIONS

Sanchez et al. Low-Temperature Growth of Epitaxial Beta-SiC on Si(100) Using Supersonic Molecular Beams of Methylsilane. 2002. J. Phys. Chem. B. 106, 8019-8028.*

(Continued)

*Primary Examiner* — Julio J Maldonado
*Assistant Examiner* — Molly Reida
(74) *Attorney, Agent, or Firm* — J.C. Patents

(57) ABSTRACT

A method for fabricating FinFETs is described. A semiconductor substrate is patterned to form odd fins. Spacers are formed on the substrate and on the sidewalls of the odd fins, wherein each spacer has a substantially vertical sidewall. Even fins are then formed on the substrate between the spacers. A semiconductor structure for forming FinFETs is also described, which is fabricated using the above method.

13 Claims, 2 Drawing Sheets

(56) References Cited

U.S. PATENT DOCUMENTS

| | | |
|---|---|---|
| 7,888,192 B2 | 2/2011 | Marshall et al. |
| 2004/0195624 A1 | 10/2004 | Liu et al. |
| 2005/0051825 A1 | 3/2005 | Fujiwara et al. |
| 2006/0099830 A1 | 5/2006 | Walther et al. |
| 2006/0286729 A1 | 12/2006 | Kavalieros et al. |
| 2007/0010049 A1* | 1/2007 | Anderson et al. ............. 438/197 |
| 2007/0108528 A1 | 5/2007 | Anderson et al. |
| 2007/0158756 A1 | 7/2007 | Dreeskornfeld et al. |
| 2008/0020515 A1* | 1/2008 | White et al. ................... 438/118 |
| 2008/0121970 A1* | 5/2008 | Aritome ........................ 257/316 |
| 2008/0157208 A1 | 7/2008 | Fischer et al. |
| 2009/0124097 A1 | 5/2009 | Cheng |
| 2009/0159936 A1* | 6/2009 | Shah et al. .................... 257/288 |
| 2009/0242964 A1 | 10/2009 | Akil et al. |
| 2009/0269916 A1 | 10/2009 | Kang et al. |
| 2010/0048027 A1 | 2/2010 | Cheng et al. |
| 2010/0072553 A1 | 3/2010 | Xu et al. |
| 2010/0144121 A1 | 6/2010 | Chang et al. |
| 2010/0167506 A1 | 7/2010 | Lin et al. |
| 2010/0193770 A1* | 8/2010 | Bangsaruntip et al. ......... 257/24 |
| 2012/0028473 A1* | 2/2012 | Lai et al. ........................ 438/703 |
| 2012/0043597 A1* | 2/2012 | Chen et al. .................... 257/296 |
| 2014/0054650 A1* | 2/2014 | Colinge ........................ 257/192 |

OTHER PUBLICATIONS

NPL_1. Archived wikipedia entry of SiC.*
NPL_2. Archived wikipedia entry of Si.*

* cited by examiner

METHOD FOR FABRICATING FINFETS AND SEMICONDUCTOR STRUCTURE FABRICATED USING THE METHOD

BACKGROUND OF THE INVENTION

1. Field of Invention

This invention relates to a semiconductor process, and particularly relates to a method for fabricating fin-type field-effect transistors (FinFETs), and a semiconductor structure that is fabricated using the method.

2. Description of Related Art

MOS is a basic structure widely applied to various semiconductor devices, such as memory devices, image sensors and display devices.

The traditional MOS transistor is difficult to scale down due to the limitation of the fabricating process, so double-gate transistors with better properties are developed. One example is the FinFET, which has a 3D gate structure to enhance the control on the channel and inhibit the leakage current caused by the punch-through effect, and thus has a higher gate control capability than the conventional MOS transistor.

However, in the current FinFET process, the density of the fin patterns of the FinFET array is quite high and the thickness of the photoresist layer is quite large, so that the pattern development is difficult and an accurate pattern transfer is impossible.

SUMMARY OF THE INVENTION

Accordingly, this invention provides a method for fabricating FinFETs that is capable of solving the above problems of the prior art.

This invention also provides a semiconductor structure that is fabricated using the method of this invention.

The method for fabricating FinFETs of this invention is described as follows. A semiconductor substrate is patterned to form a plurality of odd fins. A plurality of spacers is formed on the substrate and on the sidewalls of the odd fins, wherein each spacer has a substantially vertical sidewall. A plurality of even fins is then formed on the substrate between the spacers.

In an embodiment, the substantially vertical-sidewall spacers are formed as follows. A substantially conformal material layer is formed over the substrate. An anisotropic treatment partially changing the etching selectivity of the material layer is performed to the material layer. The material layer is then selectively etched. The anisotropic treatment may include an ion-implantation process or a plasma treatment.

The semiconductor structure for forming FinFETs of this invention includes a semiconductor substrate, a plurality of odd fins on the substrate, and a plurality of even fins on the substrate between the odd fins. The odd fins are defined from the substrate. The even fins are different from the odd fins in at least one of the width and the material, and may be further different from the odd fins in the height.

In the method for fabricating FinFETs of this invention, since the odd fins are formed prior to the even fins, the fin pattern density is greatly lowered and the thickness of the photoresist layer can be reduced, so that the development of fin patterns is much easier. Moreover, since the even fins are not formed simultaneously with the odd fins, the width thereof can be controlled by the width of each spacer or the thickness of the substantially conformal layer for forming the spacers, and the height thereof can be controlled by the growth process thereof, the even fins can be different from the odd fins in at least one of the height, the width and the material.

In order to make the aforementioned and other objects, features and advantages of the present invention comprehensible, a preferred embodiment accompanied with figures is described in detail below.

DESCRIPTION OF EMBODIMENTS

It is noted that the following embodiment is intended to further explain this invention but not to limit its scope.

Figure 4:
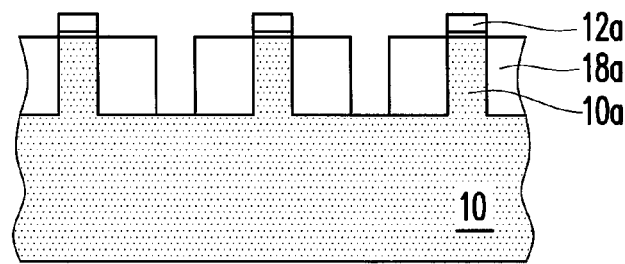
Figure 5:
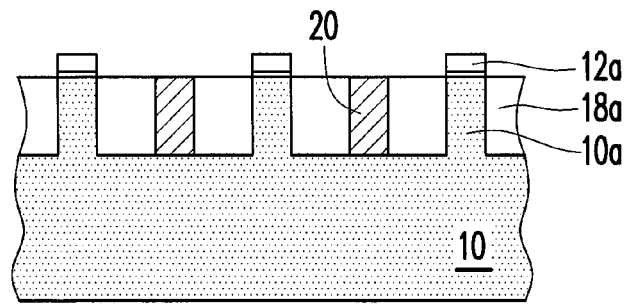
Figure 6:
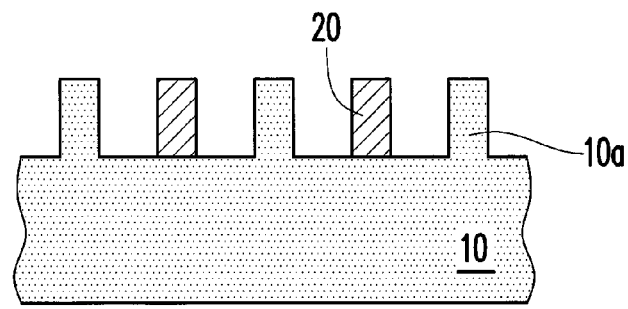

FIGS. 1-6 illustrate, in a cross-sectional view, a method for fabricating FinFETs patterning process according to an embodiment of this invention, wherein FIG. 6 also illustrates a semiconductor structure according to the embodiment.

Figure 1:
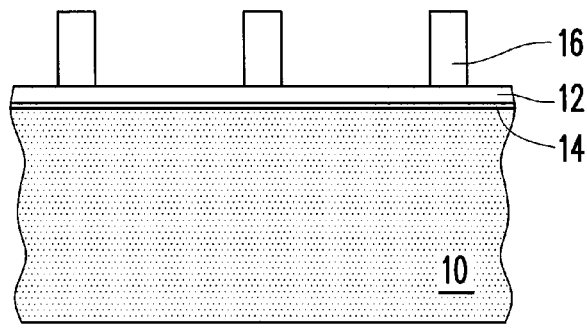
FIGS. 1-6 illustrate, in a cross-sectional view, a method for fabricating FinFETs patterning process according to an embodiment of this invention, wherein FIG. 6 also illustrates a semiconductor structure according to the embodiment.

Referring to FIG. 1, a semiconductor substrate 10 is provided, which may be a lightly doped single-crystal silicon substrate. A hard mask layer 12 is then formed on the substrate 10, possibly including silicon nitride (SiN) or SiON. When the hard mask layer 12 includes SiN, pad oxide 14 may be formed on the substrate 10 in advance. A patterned photoresist layer 16 with the patterns of the odd fins of the FinFETs is then formed on the hard mask layer 12. The photoresist layer 16 may include a positive or negative photoresist material.

Figure 2:
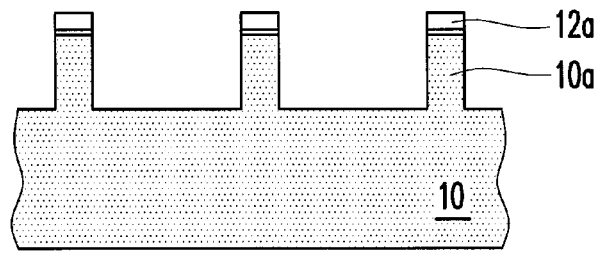

Referring to FIG. 2, after the hard mask layer 12 is patterned using the patterned photoresist layer 16 as a mask, the substrate 10 is successively etched and patterned using the patterned photoresist layer 16 and the pattered hard mask layer 12a as a mask to form a plurality of odd fins 10a. The patterned photoresist layer 16 is usually entirely consumed in the patterning process.

Figure 3:
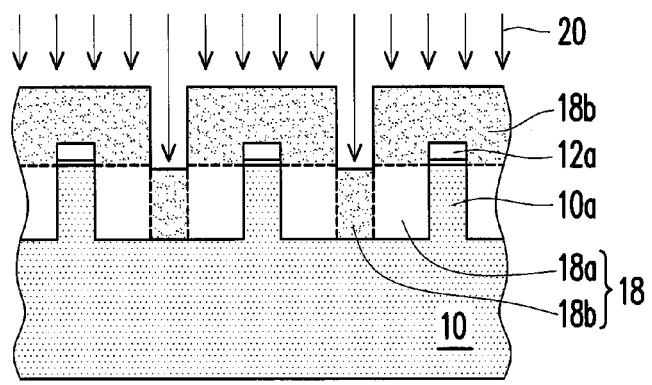

Referring to FIG. 3, a substantially conformal material layer 18 is formed over the substrate 10. The material layer 18 may be formed by an atomic layer deposition (ALD) process or a furnace deposition process, and the material thereof may be SiN. An anisotropic treatment 20 partially changing the etching selectivity of the material layer 18 is then performed to the material layer 18, forming low-selectivity regions 18a on the substrate 10 and on the sidewalls of the odd fins 10a, and high-selectivity regions 18b over the odd fins 10a and under the recesses regions of the material layer 18. The anisotropic treatment 20 is conducted in a manner such that the interface between any pair of a low-selectivity region 18a and an adjacent high-selectivity region 18b under a recesses region of the material layer 18 is substantially vertical. The anisotropic treatment 20 may include an ion-implantation process or a plasma treatment.

Referring to FIG. 4, a selective etching process is performed to remove the high-selectivity regions 18b, leaving the low-selectivity regions 18a as a plurality of spacers on the substrate 10 and on the sidewalls of the odd fins 10a, wherein each of the spacers 18a has a substantially vertical sidewall because the interface between any pair of a low-selectivity region 18a and an adjacent high-selectivity region 18b under a recesses region of the material layer 18 is substantially vertical.

In an embodiment, the material layer 18 includes SiN, the anisotropic treatment 20 includes an ion-implantation process that implants carbon ions in the to-be-removed portions of the material layer 18, and the selective etching for removing the high-selectivity regions 18b of the material layer 18 utilizes phosphoric acid.

Referring to FIG. 5, a plurality of even fins 20 is then formed on the substrate 10 between the spacers 18a, possibly by an epitaxy process as a selective deposition process based on the exposed surfaces of the semiconductor substrate 10. When the semiconductor substrate 10 includes Si, the product material of the epitaxy process may be Si, SiGe or SiC.

Since the even fins 20 are not formed simultaneously with the odd fins 10a, the material thereof can be different from that of the odd fins 10a. For example, it is possible that the odd fins 10a include Si and the even fins 20 comprise SiC or SiGe. Nevertheless, the even fins 20 may alternatively be formed from the same material (e.g., Si) of the odd fins 10a, which is namely the material of the substrate 10, by epitaxy.

In addition, the width of each even fin 20 can be controlled by the width of each spacer 18a (see FIG. 4), which is in turn controlled by the deposition thickness of the substantially conformal material layer 18 for forming the spacers 18a (see FIG. 3). The height of the even fins 20 can be controlled by the growth process of the even fins 20. Accordingly, the even fins 20 may be different from the odd fins 10a in at least one of the height, the width and the material.

Referring to FIG. 6, the pattered hard mask layer 12a and the spacers 18a are removed, leaving the odd fins 10a and even fins 20 that are arranged alternately.

FIG. 6 also illustrates a semiconductor structure according to the embodiment of this invention. The semiconductor structure includes odd fins 10a and even fins 20 that are arranged alternately. The odd fins 10a are defined from the semiconductor substrate 10. The even fins 20 may be different from the odd fins 10a in at least one of the width and the material, and may be further different from the odd fins 10a also in height, as mentioned above.

In the above embodiment of this invention, since the odd fins are formed prior to the even fins, their pattern density is greatly reduced and the thickness of the photoresist layer can be reduced, so that the development of fin patterns is much easier.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating fin-type field-effect transistors (FinFETs), comprising:
   patterning a semiconductor substrate to form a plurality of odd fins of the FinFETs comprising a first semiconductor material;
   forming a plurality of spacers on the substrate and on sidewalls of the odd fins of the FinFETs, wherein each of the spacers has a substantially vertical sidewall; and
   forming, in presence of the spacers, a plurality of even fins of the FinFETs comprising a second semiconductor material on the substrate between the spacers.

2. The method of claim 1, wherein forming the spacers comprises:
   forming a substantially conformal material layer over the substrate;
   performing, to the material layer, an anisotropic treatment that partially changes etching selectivity of the material layer; and
   selectively etching the material layer.

3. The method of claim 2, wherein the anisotropic treatment comprises an ion-implantation process.

4. The method of claim 3, wherein the material layer comprises silicon nitride, the ion-implantation process implants carbon ions in the material layer, and the selective etching utilizes phosphoric acid.

5. The method of claim 2, wherein the anisotropic treatment comprises a plasma treatment.

6. The method of claim 2, wherein forming the substantially conformal material layer comprises an atomic layer deposition (ALD) process.

7. The method of claim 2, wherein forming the substantially conformal material layer comprises a furnace deposition process.

8. The method of claim 2, wherein forming the odd fins comprises:
   forming, on the substrate, a patterned mask layer having patterns of the odd fins; and
   patterning the substrate using the patterned mask layer as a mask.

9. The method of claim 1, wherein forming the even fins comprises an epitaxy process.

10. The method of claim 9, wherein the odd fins comprise Si and the even fins comprise SiC or SiGe.

11. The method of claim 9, wherein the odd fins and the even fins comprise Si.

12. The method of claim 1, wherein the even fins are different from the odd fins in at least one of height, width and material.

13. The method of claim 1, wherein the spacers are formed on the substrate and on sidewalls of the odd fins without using a patterning mask.

* * * * *